(12) United States Patent
Yamamoto et al.

(10) Patent No.: US 7,600,933 B2
(45) Date of Patent: Oct. 13, 2009

(54) SUBSTRATE PROCESSING APPARATUS

(75) Inventors: Taro Yamamoto, Koshi (JP); Hideo Funakoshi, Koshi (JP); Yuichiro Inatomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/260,637

(22) Filed: Oct. 29, 2008

(65) Prior Publication Data
US 2009/0135384 A1   May 28, 2009

(30) Foreign Application Priority Data
Nov. 22, 2007   (JP)   ............... 2007-302720

(51) Int. Cl.
*G03D 5/00* (2006.01)
*B05C 11/02* (2006.01)
*B05C 13/00* (2006.01)

(52) U.S. Cl. .................. 396/611; 118/52; 118/58

(58) Field of Classification Search ............ 396/611; 118/52, 58; 355/57; 430/270
See application file for complete search history.

(56) References Cited
U.S. PATENT DOCUMENTS
6,248,168 B1 *   6/2001   Takeshita et al. ............. 118/52

2006/0237127 A1 *  10/2006   Inatomi ................. 156/272.2
2007/0238028 A1 *  10/2007   Inatomi ..................... 430/5

FOREIGN PATENT DOCUMENTS
JP   2005-19969    1/2005
JP   2005-310953   11/2005

* cited by examiner

*Primary Examiner*—Alan A Mathews
(74) *Attorney, Agent, or Firm*—Oblon, Spivak, McClelland, Maier & Neustadt, L.L.P.

(57) ABSTRACT

A substrate processing apparatus includes a substrate holding stage to hold a substrate having a surface facing up, the substrate having an exposed and developed resist pattern over the surface, a rotation driving mechanism to rotate the substrate holding stage around a vertical axis, a solvent vapor discharge nozzle having a discharge hole capable of discharging solvent vapor to swell the resist pattern onto the surface of the substrate and a vacuum opening capable of absorbing the solvent vapor discharged from the discharge hole, and a moving mechanism to move the solvent vapor discharge nozzle from an edge to a center of the substrate. The substrate is rotated around the vertical axis while moving the solvent vapor discharge nozzle from the edge to the center of the substrate, discharging the solvent vapor from the discharge hole, to supply the solvent vapor over the substrate in a spiral manner.

7 Claims, 13 Drawing Sheets

SUBSTRATE PROCESSING APPARATUS

BACKGROUND OF THE INVENTION

1. Field of the Invention

The present invention relates to a substrate processing apparatus to improve roughness caused on a surface of a resist film formed over a substrate such as a semiconductor wafer.

2. Description of the Related Art

In general, photolithography steps in a process to manufacture a semiconductor device include, for example, a resist application process to form a resist film by applying a resist solution over a base film of a semiconductor wafer (hereinafter called a wafer), an exposure process to expose a predetermined circuit pattern on a surface of the wafer, a development process to develop the exposed wafer with a developer, an etching process to etch the base film of the wafer and the like.

After the aforementioned development process, plural striations appear in horizontal and vertical directions on side surfaces, and depressions and projections (LWR (Line Width Roughness) and LER (Line Edge Roughness)) appear on a surface of a resist pattern R as shown in FIG. 14 due to a wave property of light (for example, wavelengths of KrF and ArF are 248 nm and 193 nm respectively) emitted onto the surface of the wafer in the exposure process. When etching the base film by using a mask of the resist pattern R having a rough surface caused by the projections and depressions, projections and depressions such as striations reflecting the striations of the resist pattern R also appear on the base film. As a result, a precise circuit pattern cannot be formed, which degrades a quality of a manufactured semiconductor device.

As a method to improve the aforementioned depressions and projections (LWR (Line Width Roughness) and LER (Line Edge Roughness)), there is disclosed a method (smoothing process) by the present applicant (for example, Patent Document 1) to smooth a top surface of a resist pattern by dissolving the top surface using solvent vapor of a resist (see Patent Document 1).

This smoothing process method employs a scanning method in which a nozzle N provided to face a surface of a substrate such as a wafer W held on a substrate holding stage (not shown) is moved in parallel with the wafer W and solvent vapor is discharged from a discharge hole Na which is provided in the nozzle N to be longer than a diameter of the wafer W, onto the surface of the wafer W which underwent exposure and development as shown in FIGS. 12 and 13. As a result, the resist pattern swells and the depressions and projections caused on the surface of the resist pattern are smoothed.

[Patent Document 1] Japanese Patent Application Publication No. 2005-19969 (claims, FIGS. 4 and 5)

In the scanning method disclosed in Patent Document 1, however, the discharge hole is longer than the diameter of the wafer W. Therefore, the solvent vapor is discharged in areas A where the wafer W does not exist as shown in FIG. 13, which results in wasting the solvent. When smoothing a pattern with a high aspect ratio, a pattern of holes, and the like in particular, the amount of solution is required to be increased to apply an impact pressure. Thus, the waste of the solvent is of concern again.

Moreover, to prevent a solvent vapor atmosphere from diffusing inside the apparatus, safety measures are required, such as sealing up the smoothing process apparatus (module), controlling exhaust of air, and forming an explosion proof structure.

SUMMARY OF THE INVENTION

It is an object of at least one embodiment of the invention to provide a substrate processing apparatus in which a solvent is not wasted, a smoothing process with a higher impact pressure of solvent vapor becomes easier, leakage of the solvent vapor outside the nozzle is prevented, and process efficiency can be improved.

According to one aspect of the invention, a substrate processing apparatus includes a substrate holding stage configured to hold a substrate with a surface of the substrate facing up, the substrate having an exposed and developed resist pattern over the surface, a rotation driving mechanism configured to rotate the substrate holding stage around a vertical axis, a solvent vapor discharge nozzle having a discharge hole capable of discharging solvent vapor to swell the resist pattern onto the surface of the substrate held on the substrate holding stage and a vacuum opening capable of absorbing the solvent vapor discharged from the discharge hole, and a moving mechanism configured to move the solvent vapor discharge nozzle from an edge to a central area of the substrate held on the substrate holding stage. The substrate is rotated around the vertical axis at the same time as moving the solvent vapor discharge nozzle from the edge to the central area of the substrate while discharging the solvent vapor from the discharge hole, thereby the solvent vapor is supplied over the substrate in a spiral manner.

By rotating the substrate holding stage and the substrate about the vertical axis and moving the solvent vapor discharge nozzle from the edge to the center of the substrate while discharging the solvent vapor, the solvent vapor can be supplied on the surface of the substrate in the spiral manner. Thus, the resist pattern can be swollen by supplying the solvent vapor on only the top surface of the resist pattern formed over the surface of the substrate. Moreover, excess solvent vapor can be quickly absorbed into a vacuum opening.

According to a second aspect of the invention, a substrate processing apparatus includes a substrate holding stage configured to hold a substrate with a surface of the substrate facing up, the substrate having an exposed and developed resist pattern over the surface, a rotation driving mechanism configured to rotate the substrate holding stage around a vertical axis, a solvent vapor discharge nozzle having a discharge hole capable of discharging solvent vapor to swell the resist pattern onto the surface of the substrate held on the substrate holding stage and a vacuum opening capable of absorbing the solvent vapor discharged from the discharge hole, a cleaning nozzle provided adjacently to the solvent vapor discharge nozzle and configured to discharge a cleaning solvent onto the surface of the substrate held on the substrate holding stage, a moving mechanism configured to move the solvent vapor discharge nozzle and the cleaning nozzle from an edge to a central area of the substrate held on the substrate holding stage, a cup configured to surround a side and a bottom of the substrate holding stage, and an elevating mechanism configured to elevate a side wall of the cup. The substrate is rotated around the vertical axis at the same time as moving the solvent vapor discharge nozzle from the edge to the central area of the substrate while discharging the solvent vapor from the discharge hole to supply the solvent vapor over the substrate in a spiral manner, then the substrate is rotated around the vertical axis and the cleaning solvent is supplied from the cleaning nozzle onto the central area of the substrate with the side wall of the cup elevated, and the supply of the cleaning solvent is stopped and the substrate is rotated around the vertical axis to remove the cleaning solvent.

By rotating the substrate holding stage and the substrate about the vertical axis and moving the solvent vapor discharge nozzle from the edge to the center of the substrate while discharging the solvent vapor, the solvent vapor can be supplied on the surface of the substrate in a spiral manner. Thus, the resist pattern can be swollen by supplying the solvent vapor on only the top surface of the resist pattern formed over the surface of the substrate. Moreover, excess solvent vapor can be quickly absorbed into a vacuum opening. Further, a cleaning solvent is supplied from a cleaning nozzle to the center of the substrate while rotating the substrate about the vertical axis with the side walls of the cup elevated. After that, the substrate is rotated about the vertical axis to scatter off the cleaning solvent.

According to a third aspect of the invention, a dew condensation preventive heater is provided in a vicinity of the discharge hole of the solvent vapor discharge nozzle in the substrate processing apparatus. In this case, an electric heater, a temperature control heater using a heat carrier such as temperature control water, or the like can be used as the heater.

As a result, dew condensation of the solvent vapor caused in a discharge hole part of the nozzle can be prevented.

According to a fourth aspect of the invention, the solvent vapor discharge nozzle in the substrate processing apparatus has a depression with a downward opening capable of holding an atmosphere of the solvent vapor, the discharge hole is provided at a bottom of the depression, and a vacuum opening is provided in a bottom end of the depression around the opening.

As a result, the solvent vapor discharged from the discharge hole can be stored in the depression, whereby an atmosphere of the solvent vapor can be formed. Excess solvent vapor can be absorbed into the vacuum opening provided around the discharge hole.

According to a fifth aspect of the invention, an approach stage having a surface on almost the same level as the surface of the substrate held on the substrate holding stage is provided in a vicinity of the substrate holding stage in the substrate processing apparatus.

As a result, with the solvent vapor discharge nozzle moved over the approach stage, the solvent vapor is discharged from the discharge hole until the discharge state of the solvent vapor is stabilized. Then, the solvent vapor can be stably supplied on the surface of the substrate.

According to a sixth aspect of the invention, a top portion of the cup includes an approach stage having a surface on almost the same level as the surface of the substrate held on the substrate holding stage in the substrate processing apparatus.

As a result, with the solvent vapor discharge nozzle moved over the approach stage provided as a top portion of the cup, which is not required when supplying the solvent vapor, the solvent vapor is discharged from the discharge hole until the discharge state of the solvent vapor is stabilized. Then, the solvent vapor can be stably supplied on the surface of the substrate.

According to a seventh aspect of the invention, a dew condensation preventive heater is provided in a vicinity of the discharge hole of the solvent vapor discharge nozzle in the substrate processing apparatus.

By the substrate processing apparatus of the invention with the aforementioned configurations, following effects are obtained.

According to one embodiment, the resist pattern can be swollen by supplying solvent vapor on only the top surface of the resist pattern formed over the surface of the substrate. Moreover, excess solvent vapor can be quickly absorbed into the vacuum opening. Thus, the solvent is not wasted, the smoothing process with a raised impact pressure of the solvent vapor becomes easier, and leakage of the solvent vapor outside the nozzle is reduced, which leads to improvement in the process efficiency.

According to one embodiment, the resist pattern can be swollen by supplying solvent vapor on only the top surface of the resist pattern formed over the surface of the substrate. Moreover, excess solvent vapor can be quickly absorbed into the vacuum opening. Thus, the solvent is not wasted, the smoothing process with a raised impact pressure of the solvent vapor becomes easier, and leakage of the solvent vapor outside the nozzle is suppressed, which leads to improvement in the process efficiency. Further, the substrate can be cleaned and dried after the smoothing process.

According to one embodiment, dew condensation caused by the solvent vapor in the discharge hole part of the nozzle can be prevented. Therefore, reduction of a process precision due to the dew condensation can be prevented. In particular, the dew condensation which is easily generated when using high concentration organic solvent vapor can be prevented.

According to one embodiment, solvent vapor discharged from the discharge hole can be held in the depression to form an atmosphere of the solvent vapor. The excess solvent vapor can be absorbed into the vacuum opening provided around the discharge hole. As a result, the process precision can be improved and leakage of the solvent vapor outside the nozzle can be suppressed.

According to one embodiment, with the solvent vapor discharge nozzle moved over the approach stage, the solvent vapor is discharged from the discharge hole until the discharge state of the solvent vapor is stabilized. Then, the solvent vapor can be stably supplied on the surface of the substrate. Thus, the solvent vapor can be efficiently supplied.

According to one embodiment, with the solvent vapor discharge nozzle moved over the approach stage provided as a top portion of the cup, which is not required when supplying the solvent vapor, the solvent vapor is discharged from the discharge hole until the discharge state of the solvent vapor is stabilized. Then, the solvent vapor can be stably supplied on the surface of the substrate. Therefore, the solvent vapor can be efficiently supplied, less components are required to provide the cup and the approach stage, and a space can be effectively used.

DETAILED DESCRIPTION OF THE PREFERRED EMBODIMENT

Embodiments of the invention will be described in detail with reference to the drawings.

The substrate processing apparatus of the invention employed in a resist application and development processing system is described here.

Figure 1:
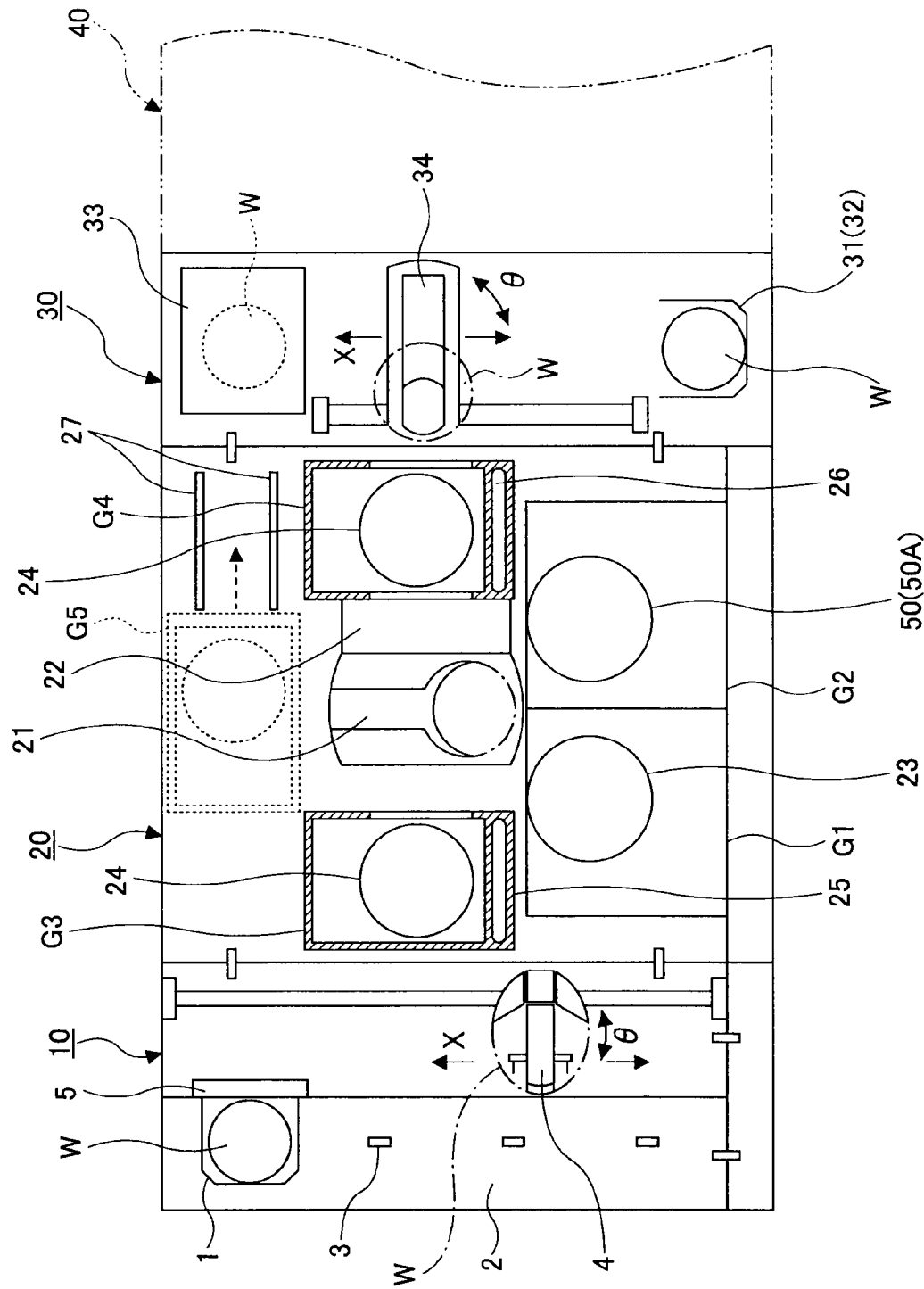
FIG. 1 is a schematic plan view showing an example of a resist application and development processing system employing thermal processing devices of this invention.
Figure 2:
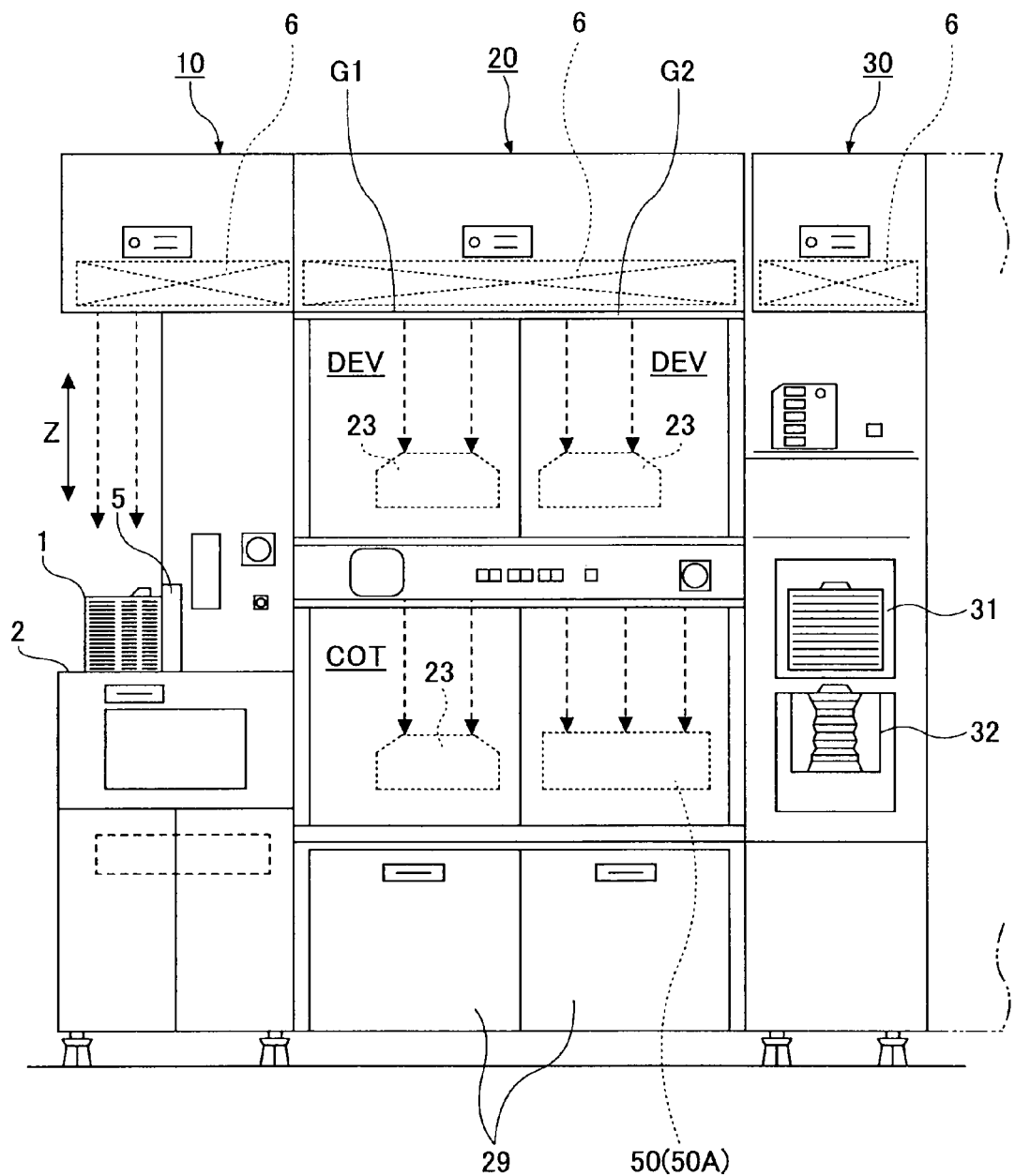
FIG. 2 is a schematic front view of the resist application and development processing system.
Figure 3:
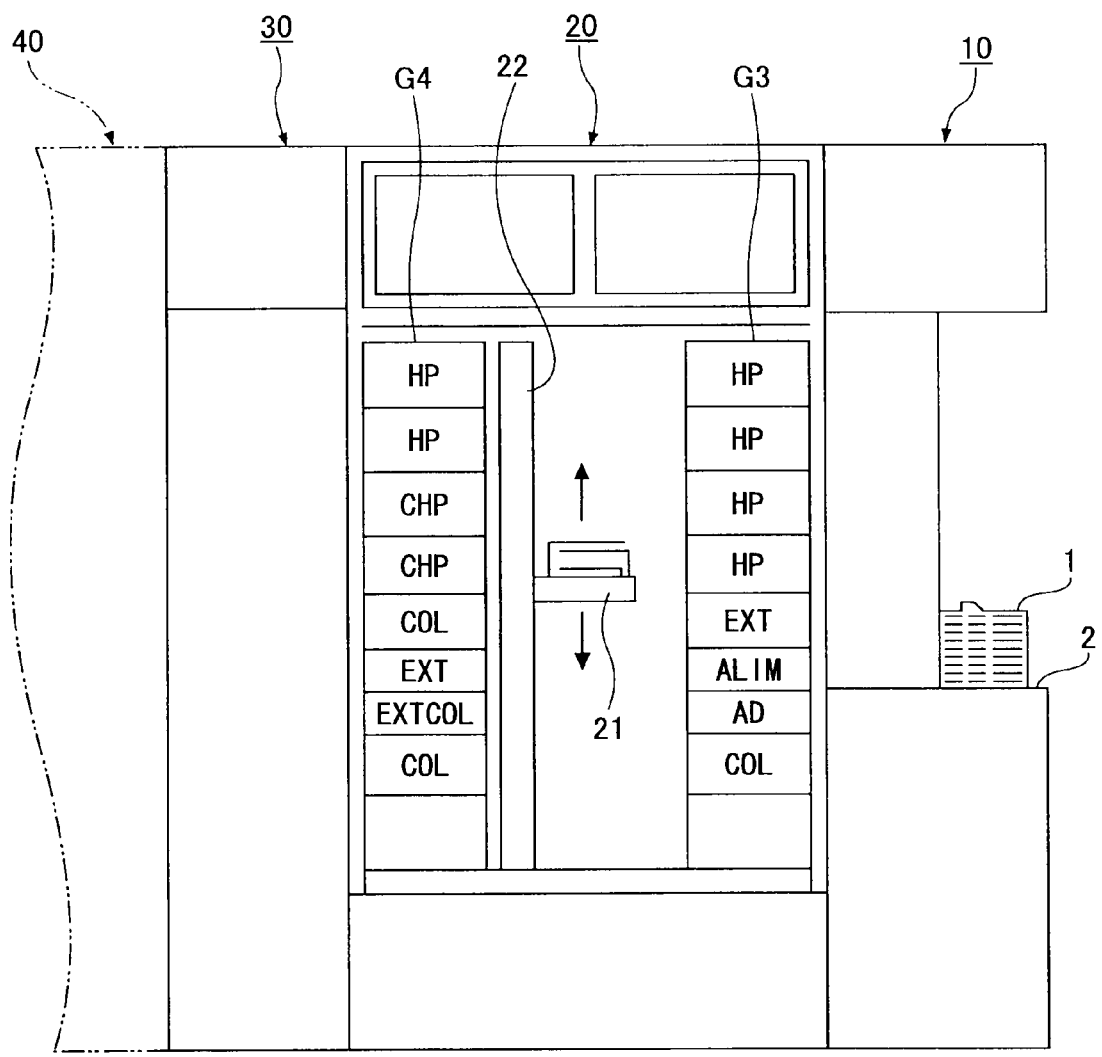
FIG. 3 is a schematic back view of the resist application and development processing system.

FIG. 1 is a schematic plan view of an embodiment of the resist application and development processing system, FIG. 2 is a front view of FIG. 1, and FIG. 3 is a back view of FIG. 1.

The resist application and development processing system has major parts configured with a cassette station 10 (carry unit) to carry plural semiconductor wafers W, for example 25 semiconductor wafers W each serving as a substrate to be processed, in or out of the system or to carry the wafer W in and out of a wafer cassette 1, a process station 20 including process apparatuses in which plural stages of various single wafer type process units are set in predetermined positions, and an interface unit 30 to pass and receive the wafer W between the process station 20 and an exposure apparatus 40 provided adjacent to the interface unit 30.

In the cassette station 10, as shown in FIG. 1, plural wafer cassettes 1 with covers, for example up to four wafer cassettes 1 with covers are aligned along a horizontal X direction, each have an access opening facing the process station 20 side. A cover opening and closing device 5 is provided to oppose each wafer cassette 1. Wafer carry tweezers 4, which can move in the cassette alignment direction (X direction) and a wafer alignment direction (Z direction) of the wafers W stored in a vertical direction in the wafer cassette 1, are configured to selectively carry the wafer W to/from the wafer cassette 1. Further, the wafer carry tweezers 4 are configured to rotate in a θ direction so as to carry the wafer W to an alignment unit (ALIM) and an extension unit (EXT) included in a third plural-stage unit G3 on the process station 20 side, which will be described later.

The process station 20 has a vertical carry type main wafer carry mechanism 21 which is moved in a vertical direction by a moving mechanism 22. All process units are provided in plural stages in one or plural units around the main wafer carry mechanism 21. In this example, five plural-stage units of G1, G2, G3, G4, and G5 are provided. The first and second plural-stage units G1 and G2 are arranged in parallel on the front side of the system. The third plural-stage unit G3 is arranged adjacent to the cassette station 10, the fourth plural-stage unit G4 is arranged adjacent to the interface unit 30, and the fifth plural-stage unit G5 is arranged on the back side of the system.

In this case, as shown in FIG. 2, a resist application unit (COT) in which the wafer W is mounted on a spin chuck (not shown) and a predetermined process is applied thereto, and a development unit (DEV) in which the wafer W and a developer supplier (not shown) are opposed in a cup (container) 23 and a resist pattern is developed, are stacked vertically in two stages in that order from the bottom. In the second unit G2, a smoothing process apparatus 50 serving as the substrate processing apparatus of the invention (hereinafter called a smoothing process apparatus 50) and a development unit (DEV) are vertically stacked in two stages in that order from the bottom. The resist application unit (COT) and the smoothing process apparatus 50 are provided in the lower stage in consideration of drainage of the resist solution and exhaust air for the resist solvent, which are not easy in view of mechanics and maintenance. However, the resist application unit (COT) and the smoothing process apparatus 50 may be provided on an upper side of the system as required.

As shown in FIG. 3, the third unit G3 includes oven type process units in which predetermined processes are applied to a wafer W mounted on a wafer mounting stage 24, such as a cooling unit (COL) to cool the wafer W, an adhesion unit (AD) to apply a hydrophobizing process to the wafer, an alignment unit (ALIM) to align the wafer W, an extension unit (EXT) to carry in and out the wafer W, and four hot plate units (HP) having thermal processing devices to bake the wafer W, which are vertically stacked in, for example, eight stages in that order from the bottom.

The fourth unit G4 includes oven type process units such as a cooling unit (COL), an extension cooling unit (EXTCOL), an extension unit (EXT), a cooling unit (COL), two chilling hot plate units (CHP) having thermal processing devices of the invention with a quenching function, and two hot plate units (HP) having the thermal processing devices of the invention, which are vertically stacked in, for example, eight stages in that order from the bottom.

By arranging the cooling unit (COL) and the extension cooling unit (EXTCOL) with a low process temperature in the lower stages while arranging the hot plate units (HP), the chilling hot plate units (CHP), and the adhesion unit (AD) in the upper stages, mutual interference of heat among the units can be reduced. It is needless to say that the units may be randomly arranged as well.

In the process station 20 as shown in FIG. 1, ducts 25 and 26 are provided in side walls of the third and fourth plural-stage units G3 and G4 (oven type process units) which are arranged adjacent to the first and second plural-stage units G1 and G2 (spinner type process units) respectively. Clean air or air with a specially controlled temperature flows down in these ducts 25 and 26. With these ducts, heat generated in the third and fourth oven type process units G3 and G4 is blocked and is not in thermal communication with the first and second spinner type process units G1 and G2.

Further, in this process system, a fifth plural-stage unit G5 can be arranged on the back side of the main wafer carry mechanism 21 as shown by a dotted line in FIG. 1. The fifth plural-stage unit G5 can move sideways along a guide rail 27 when seen from the main wafer carry mechanism 21. Therefore, even when the fifth plural-stage unit G5 is provided, a space can be created by sliding the fifth unit G5. Thus, maintenance of the main wafer carry mechanism 21 can be easily performed from the back.

The interface unit 30 has the same size in depth as the process station 20 but smaller in width. A portable pick-up cassette 31 and a stationary buffer cassette 32 are stacked in two stages on the front side of the interface unit 30. A peripheral exposure apparatus 33 serving as an exposure unit which exposes a periphery of the wafer W and a reference mark area is provided on the back side of the interface unit 30. A carry arm 34 serving as a carry unit is provided in the central area of the interface unit 30. The carry arm 34 is configured to move in X and Z directions to carry the wafer W to the cassettes 31 and 32 and the peripheral exposure apparatus 33. The carry arm 34 is configured to rotate in a θ direction so as to carry the wafer W to an extension unit (EXT) in the fourth plural-stage unit G4 on the process station 20 side and a wafer receive stage (not shown) of the exposure apparatus provided adjacent to the carry arm 34.

The process system with the aforementioned configuration is used in a clean room, however, cleanliness of each part of the system is enhanced by applying an efficient vertical laminar flow method using, for example, HEPA filters 6 for the ceiling.

Next, the smoothing process apparatus 50 is described in detail with reference to FIGS. 4 to 11.

Embodiment 1

Figure 4:
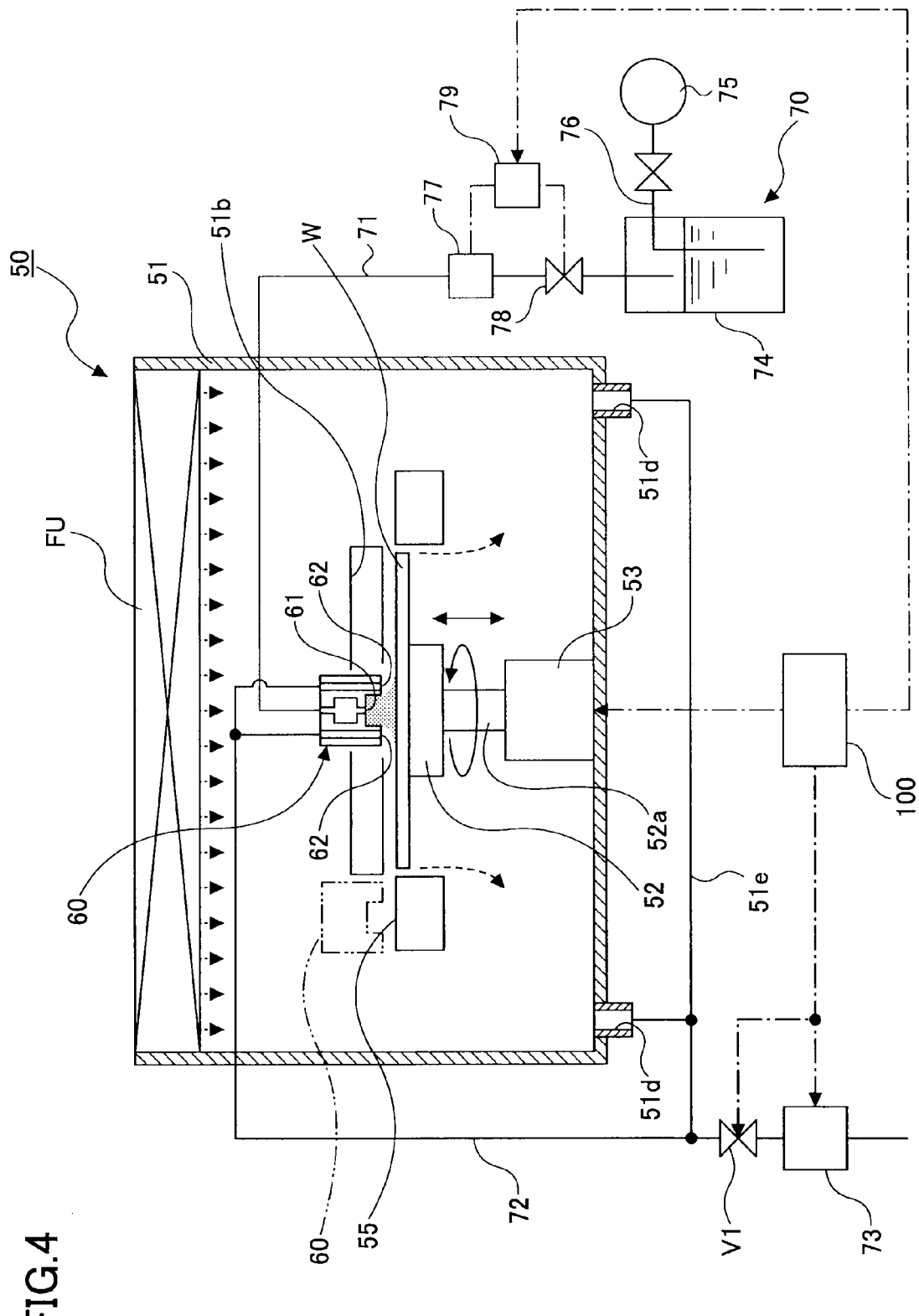
FIG. 4 is a schematic vertical cross-sectional view showing a first embodiment of a substrate processing apparatus of this invention.
Figure 5:
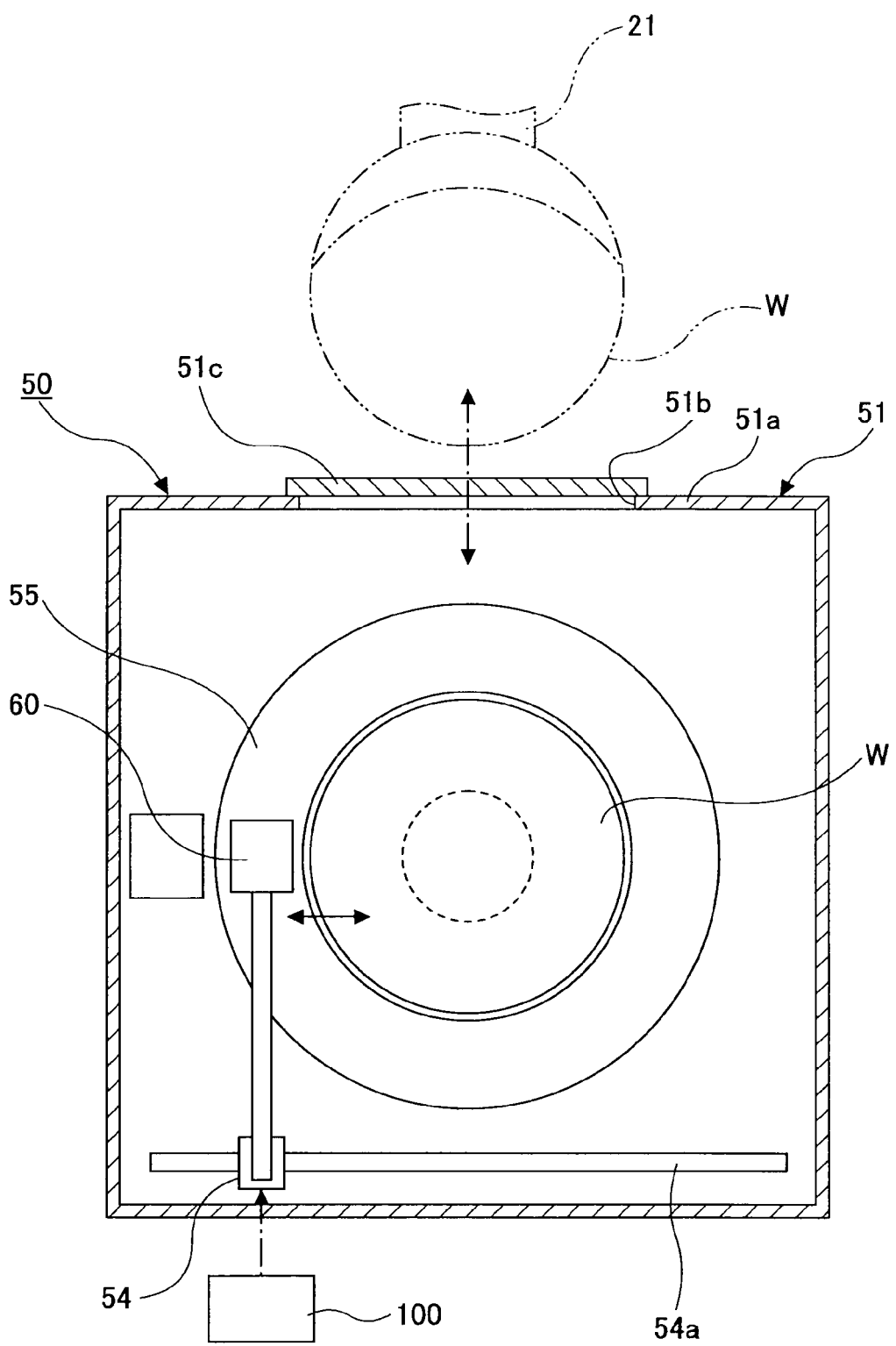
FIG. 5 is a schematic horizontal cross-sectional view of the substrate processing apparatus.

FIG. 4 is a schematic vertical cross-sectional view showing a first embodiment of the smoothing process apparatus 50 as the substrate processing apparatus of the invention. FIG. 5 is a schematic horizontal cross-sectional view of the smoothing process apparatus 50.

The smoothing process apparatus 50 has a housing 51 including a substrate holding stage 52 (hereinafter called a chuck 52) to adhere and hold the developed wafer W with a surface of the wafer W facing up, which is carried by the main wafer carry mechanism 21; a motor 53 serving as a rotation driving mechanism to rotate the chuck 52 about the vertical axis; a solvent vapor discharge nozzle 60 (hereinafter called a process nozzle 60) having a discharge hole 61 to discharge solvent vapor, which swells the resist pattern, onto the surface of the wafer W held on the chuck 52 and a vacuum opening 62 which can absorb the solvent vapor discharged from the discharge hole 61; and a moving mechanism 54 which moves the process nozzle 60 from an edge to the central area of the wafer W held on the chuck 52. A filter unit FU is provided in a top opening area of the housing 51. Air cleaned by the filter unit FU flows down to be supplied into the housing 51.

In this case, the chuck 52 adhering and holding the wafer W can be elevated by an elevating mechanism (not shown), so that the wafer W can be passed and received to/from the main wafer carry mechanism 21 which enters the housing 51 through a carry opening 51b formed in a side wall 51a of the housing 51. A shutter 51c which can be opened and closed by an opening and closing mechanism (not shown) is provided for the carry opening 51b.

Further, an approach stage 55 having a surface which is on almost the same level as the surface of the wafer W held on the chuck 52 is provided at both opposing ends of the chuck 52. With the approach stage 55, solvent vapor is discharged after the nozzle 60 is moved over the approach stage 55 until the discharge state is stabilized. Then, the solvent vapor can be stably discharged onto the surface of the wafer.

Figure 6:
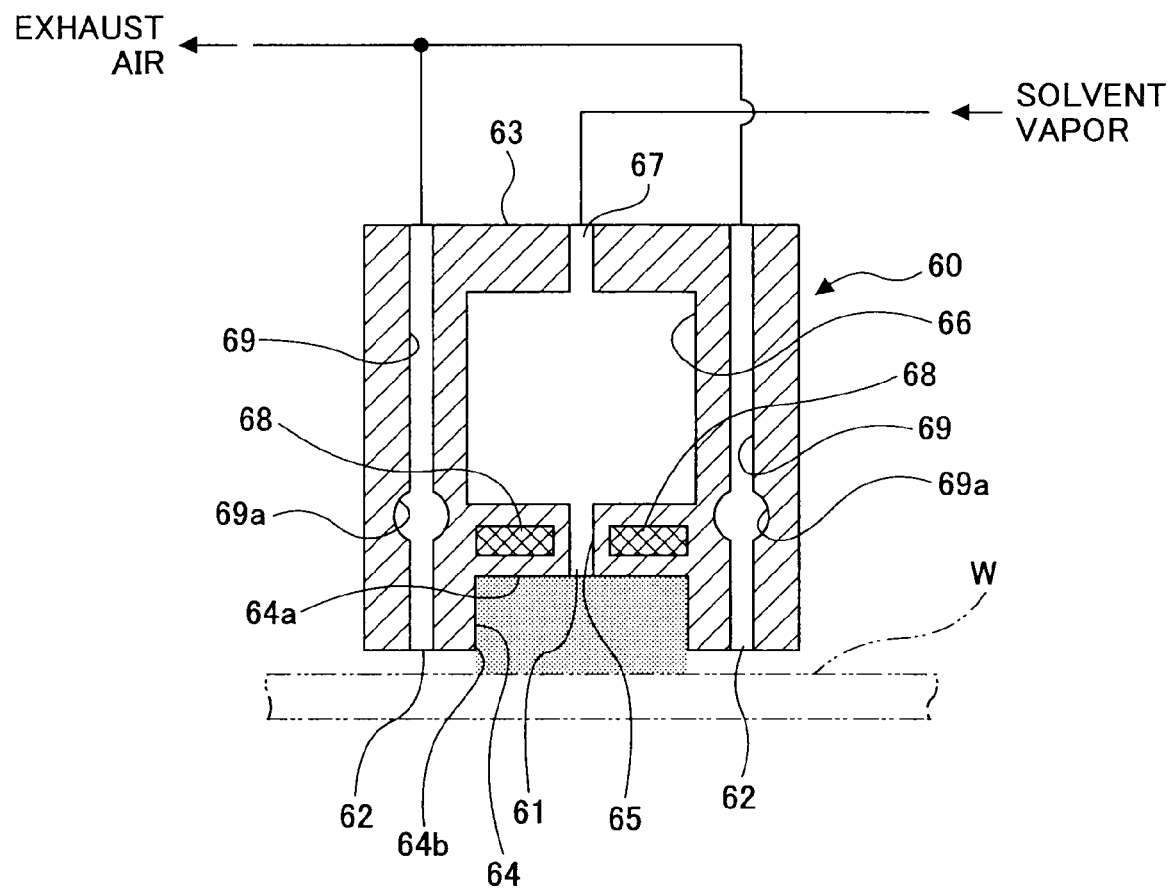
FIG. 6 is a schematic cross-sectional view showing a solvent vapor discharge nozzle of this invention.
Figure 7A:
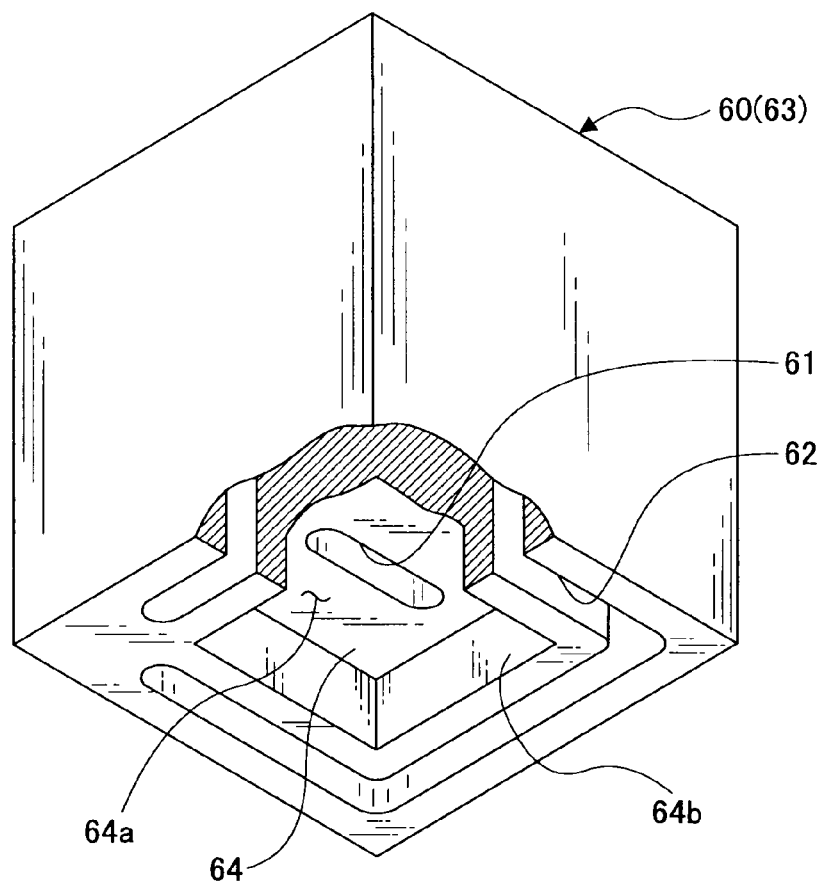
FIG. 7A and FIG. 7B are a perspective view with a partial cross-section and a bottom view of the solvent vapor discharge nozzle of this invention respectively, showing major parts of the solvent vapor discharge nozzle of this invention.
Figure 7B:
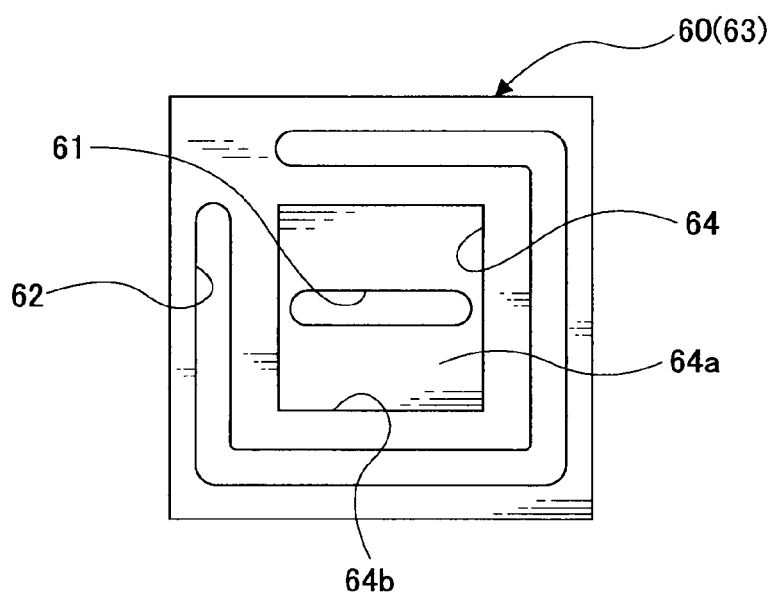

The process nozzle 60 includes a square block nozzle head 63 as shown in FIGS. 6 and 7. The nozzle head 63 has a downwardly opening square depression 64 which can hold an atmosphere of the solvent vapor. The discharge hole 61 having a long hole shape is provided in a bottom part 64a of the depression 64. A vacuum opening 62 is provided in a bottom end of the depression 64 around an aperture 64b so as to surround the discharge hole 61. The vacuum opening 62 may be open inwardly of the depression 64 in the aperture 64b. Moreover, a solvent vapor storing space 66 which is in communication with the discharge hole 61 through a communication path 65 is formed in the nozzle head 63. A supply inlet 67 which is open to the top surface of the nozzle head 63 is in communication with a top portion of the solvent vapor storing space 66. A solvent vapor supply source 70 is connected to the supply inlet 67 through a supply path 71.

The nozzle head 63 includes heaters 68 for preventing dew condensation in the vicinity of, or for example, both sides of the discharge hole 61. In this case, the heaters 68 are electric heaters driven by a power source (not shown), which are configured to prevent dew condensation of the solvent vapor caused in the vicinity of the discharge hole. The heaters 68 are not necessarily electric heaters. For example, the heaters 68 may be temperature control heaters to flow a heat carrier such as temperature control water controlled at a predetermined temperature into a flow path provided in the nozzle head 63.

For example, the aforementioned vacuum opening 62 is formed of a continuous slot leaving one corner of the depression 64 flat, as shown in FIG. 7. The vacuum opening 62 is in communication with plural communication paths 69 through a buffer space 69a which is in communication with appropriate parts of the vacuum opening 62. The plural communication paths 69 are open to the top surface of the nozzle head 63. In this case, an air exhaust mechanism such as an air exhaust pump 73 is connected to the vacuum opening 62 through the communication path 69, an air exhaust path 72, and an open/close valve V1.

The solvent vapor supply source 70 includes a reservoir tank 74 which is connected to, for example, the supply path 71 and stores a liquid solvent, and an $N_2$ gas supply path 76 which is connected to an inert nitrogen ($N_2$) gas supply source 75 and supplies the $N_2$ gas into the reservoir tank 74. By supplying the $N_2$ gas into the liquid solvent of the reservoir tank 74 from the $N_2$ gas supply path 76, solvent vapor in the reservoir tank 74 is forced into the supply path 71. The solvent vapor is then supplied to the process nozzle 60 through the supply path 71. As the solvent, for example, acetone, propylene glycol monomethyl ether acetate (PGMEA), or N-methyl-2-pyrrolidinone (NMP) can be used.

Moreover, a flow rate sensor 77 which detects a flow rate of the solvent vapor and a control valve 78 to control the flow rate are provided in the supply path 71. Data detected by the flow rate sensor 77 is outputted to a flow rate controller 79. Based on the detected data, the flow rate controller 79 controls opening and closing of the control valve 78 to set the flow rate of the solvent vapor discharged from the process nozzle at a predetermined flow rate.

An air exhaust opening 51d is formed at a bottom of the housing 51. The air exhaust opening 51d is connected to the air exhaust pump 73 through an air exhaust pipe 51e.

Moreover, the moving mechanism 54 of the process nozzle 60 is provided movably along a guide rail 54a provided in parallel to the chuck 52. That is, the moving mechanism 54 can move in parallel to the chuck 52. The moving mechanism 54 is electrically connected to a controller 100 serving as a control unit and driven by control signals from the controller 100.

The controller 100, the motor 53, the flow rate controller 79 of the solvent vapor supplier source 70, the open/close valve V1, and the like are electrically connected to each other and controlled by the control signals from the controller 100.

Figure 8:
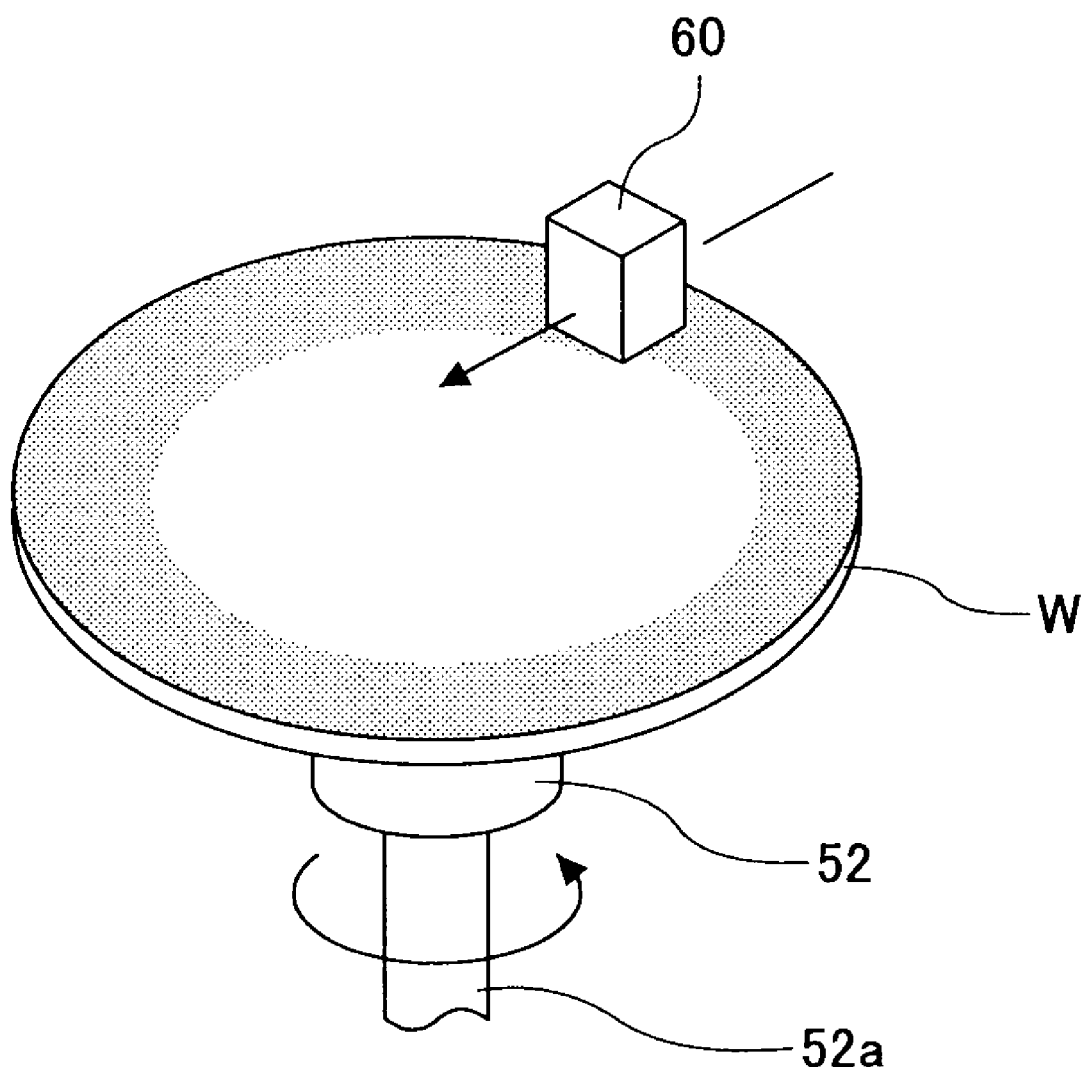
FIG. 8 is a schematic perspective view showing an operation mode of the substrate processing apparatus of the first embodiment.

Next, an operation mode of the smoothing process apparatus of the first embodiment is described with reference to FIGS. 4, 5, and 8. First, the moving mechanism 54 is driven to move the process nozzle 60 over the approach stage 55. Then, solvent vapor is supplied from the solvent vapor supply source 70 to the process nozzle 60 located over the approach stage 55 so that the solvent vapor is discharged from the discharge hole 61. When the discharge state of the solvent vapor is stabilized, the motor 53 drives the chuck 52 to rotate, and at the same time the moving mechanism 54 is driven to move the process nozzle 60 from the edge to the central area of the wafer W. As a result, the solvent vapor discharged from the discharge hole 61 of the process nozzle 60 is supplied onto the surface of the wafer W in a spiral manner. Since the resist pattern over the surface of the wafer swells, depressions and projections of the surface of the resist pattern can be smoothed.

Embodiment 2

Figure 9:
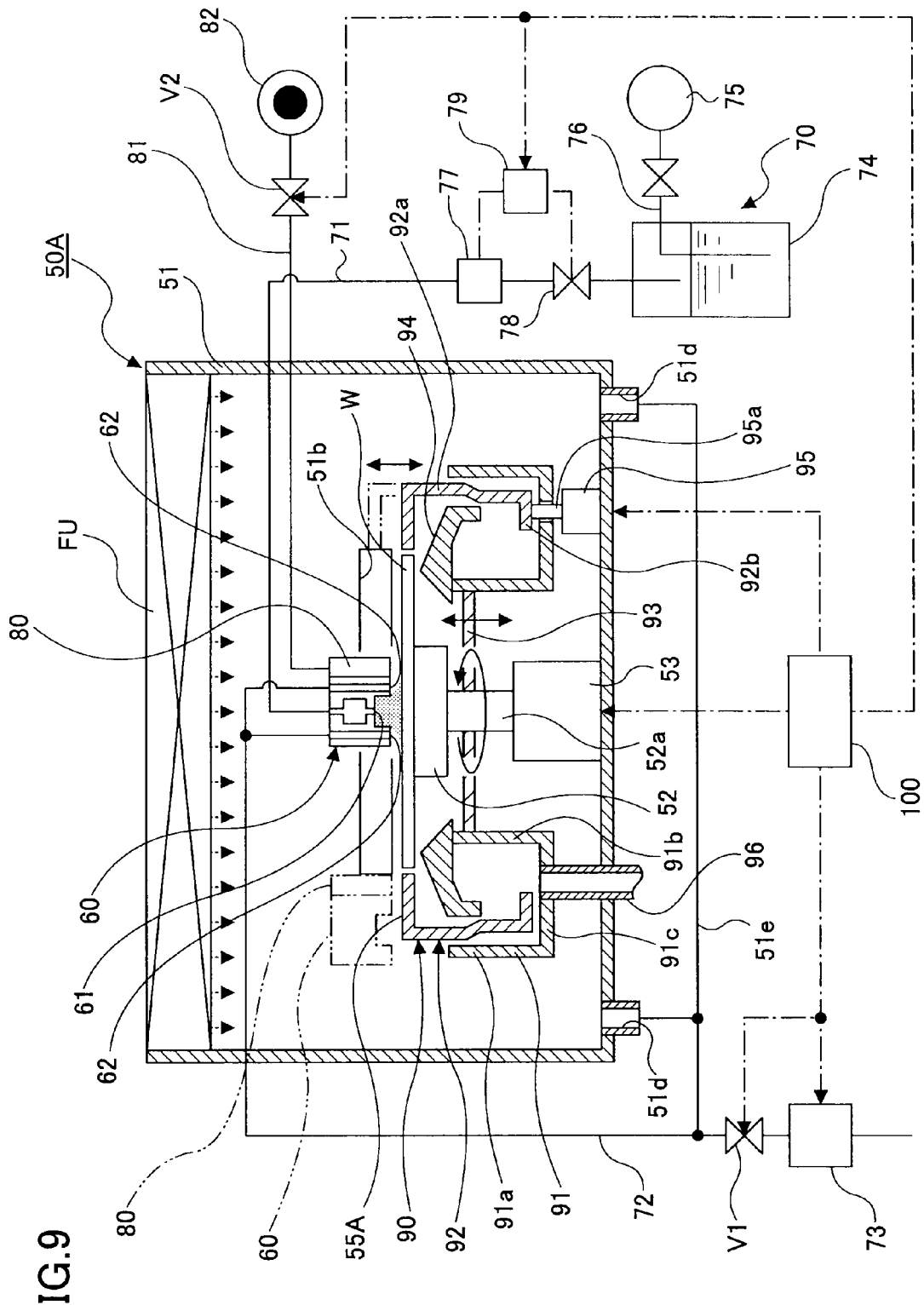
FIG. 9 is a schematic cross-sectional view of the substrate processing apparatus of the second embodiment of the invention including the solvent vapor discharge nozzle.
Figure 10A:
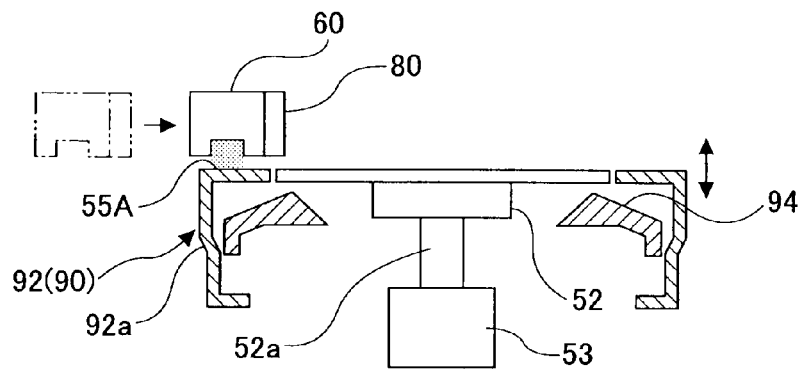
FIGS. 10A to 10D are schematic cross-sectional views showing an operation mode of the substrate processing apparatus of the second embodiment.
Figure 10B:
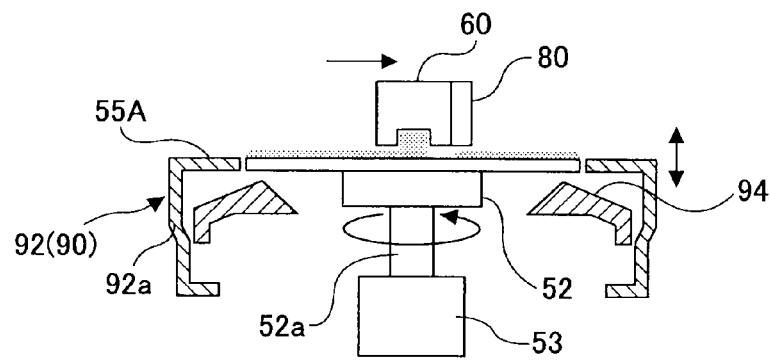
Figure 10C:
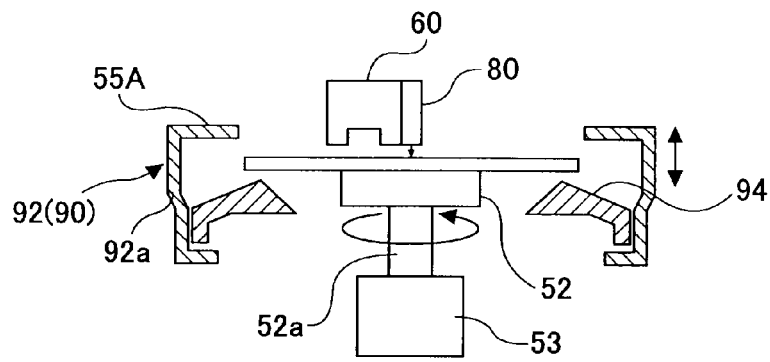
Figure 10D:
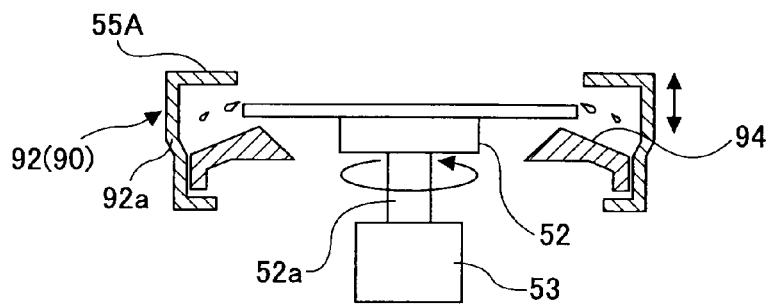

FIG. 9 is a schematic cross-sectional view of a smoothing process apparatus of a second embodiment of the invention.

In the second embodiment, the smoothing process apparatus of the invention has a cleaning function. A smoothing process apparatus 50A is different from the smoothing process apparatus 50 of the first embodiment in that a cleaning nozzle 80 and a cup 90 configured to prevent scattering of a cleaning solvent in cleaning a wafer are provided. Hereinafter, the same elements as those in the first embodiment are denoted by the same reference numerals and descriptions thereof are omitted. Instead, features of the second embodiment are described below.

The cleaning nozzle 80 of the second embodiment is provided adjacently to one side of the nozzle head 63 and is configured to discharge a cleaning solvent such as purified water onto the surface of the wafer W held on the chuck 52. The cleaning nozzle 80 is configured to be moved together with the process nozzle 60 by the moving mechanism 54. Moreover, the cleaning nozzle 80 is connected to a cleaning solvent supply source 82 through a cleaning solvent supply path 81 with an open/close valve V2. The open/close valve V2 is electrically connected to the controller 100 and operated by the control signals from the controller 100.

The cup 90, on the other hand, is mainly configured with a lower cup 91 and an upper cup 92, which surround a side and a bottom of the chuck 52. In this case, the lower cup 91 is formed annularly with a groove, having an outer casing 91a and an internal casing 91b which are located lower than the chuck 52. A disc 93 is horizontally provided on an inner side of the internal casing 91b of the lower cup 91, through which a rotation axis 52a of the chuck 52 rotatably in an air and water tight manner. On a top portion of the internal casing 91b, an entry preventive member 94 in an annular shape is provided to allow a solution entering the back surface of the wafer W held on the chuck 52 to flow into the groove of the lower cup 91. The upper cup 92 includes a side wall 92a in a cylindrical shape which is elevatably provided inside the external casing 91a of the lower cup 91, and an approach stage 55A which extends in the horizontal direction inwardly from the top portion of the side wall 92a. An elevator mechanism such as a piston rod 95a of an elevator cylinder 95 is connected to an inward flange 92b bent inwardly from a bottom portion of the side wall 92a. The piston rod 95a of the elevator cylinder 95 slidably passes through a bottom part 91c of the annular groove of the lower cup 91 in an air and water tight manner. A drain pipe 96 is connected to a portion of the bottom part 91c of the annular groove in the lower cup 91. The drain pipe 96 protrudes down from the bottom part of the housing 51.

The elevator cylinder 95 which elevates the upper cup 92 is electrically connected to the controller 100 and driven by the control signals from the controller 100. The upper cup 92 is lowered when the wafer W is passed and received between the main wafer carry mechanism 21 and the chuck 52 and when solvent vapor is discharged (supplied) from the process nozzle 60 on the surface of the wafer W, that is, except for when the wafer is cleaned and dried. In this state, a top surface of the approach stage 55A formed as a part of the upper cup 92 is almost on the same level as the surface of the wafer W held on the chuck 52. When cleaning and drying the wafer, the piston rod 95a of the elevator cylinder 95 extends to raise the upper cup 92, thereby scattering of the cleaning solvent is prevented when cleaning and drying the wafer W.

Next, an operation mode of the smoothing process apparatus 50A of the second embodiment of the invention is described with reference to FIG. 10. First, the moving mechanism 54 is driven to move the process nozzle 60 over the approach stage 55A formed as a part of the lowered upper cup 92 (see FIG. 10A). Then, solvent vapor is supplied from the solvent vapor supply source 70 to the process nozzle 60 located over the approach stage 55A to discharge the solvent vapor from the discharge hole 61. When the discharge state of the solvent vapor is stabilized, the motor 53 is driven to rotate the chuck 52. At the same time, the moving mechanism 54 is driven to move the process nozzle 60 from the edge to the central area of the wafer W. As a result, the solvent vapor discharged from the discharge hole 61 of the process nozzle 60 is supplied over the surface of the wafer W in a spiral manner. The resist pattern over the wafer surface is swollen to smooth the depressions and projections of the surface of the resist pattern (see FIG. 10B).

Next, after the smoothing process, the cleaning nozzle 80 is moved over the central area of the wafer W and a cleaning solvent (purified water) is discharged (supplied) onto the central area of the surface of the wafer W. Then, by a centrifugal force generated by rotating the wafer W, the cleaning solvent (purified water) is scattered to the periphery of the wafer W to clean the wafer W (see FIG. 10C). After that, the discharge of the cleaning solvent (purified water) from the cleaning nozzle 80 is stopped. The cleaning solvent (purified water) adhering to the surface of the wafer is scattered off by rotating the wafer W at a high rate by the chuck 52, and then the wafer W is dried (see FIG. 10D)

Other Embodiments

Figure 11A:
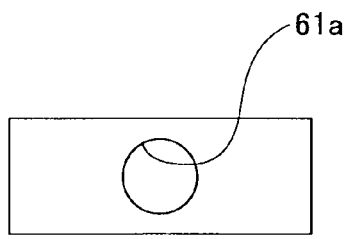
FIGS. 11A to 11I are schematic bottom views showing deformation examples of the discharge hole of this invention.
Figure 11B:
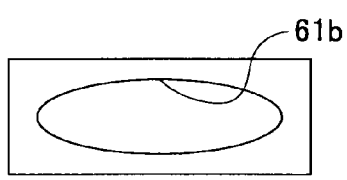
Figure 11C:
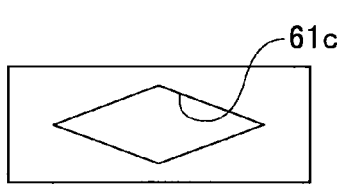
Figure 11D:
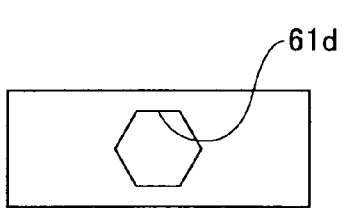
Figure 11E:
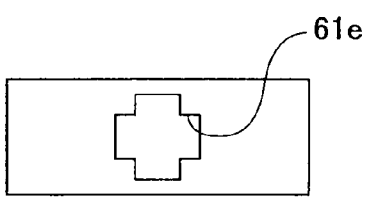
Figure 11F:
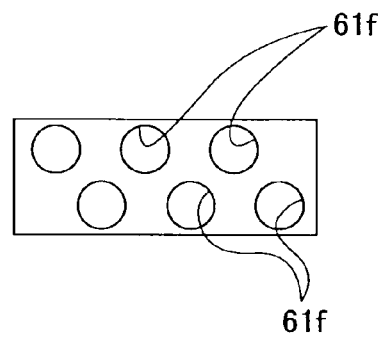
Figure 11G:
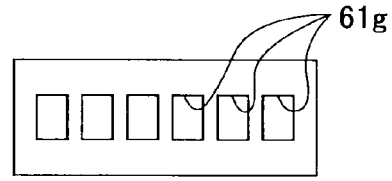
Figure 11H:
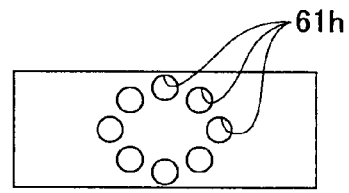
Figure 11I:
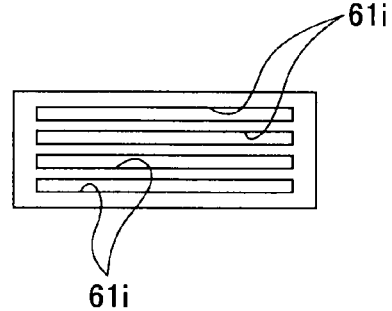
Figure 12:
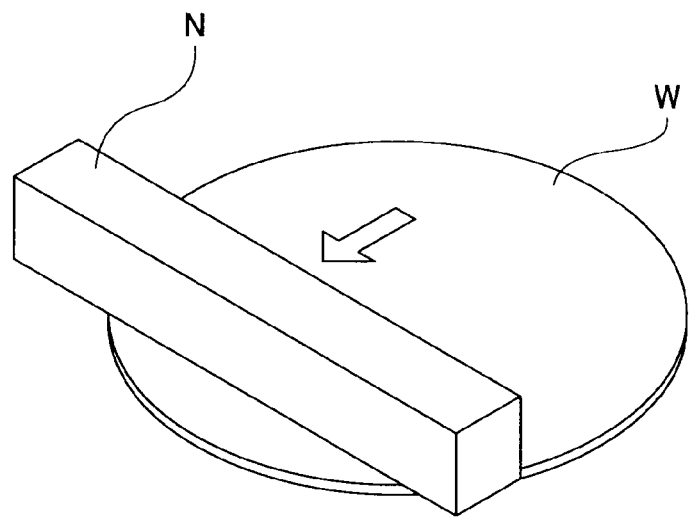
FIG. 12 is a schematic perspective view showing an operation mode of the conventional substrate processing apparatus.
Figure 13:
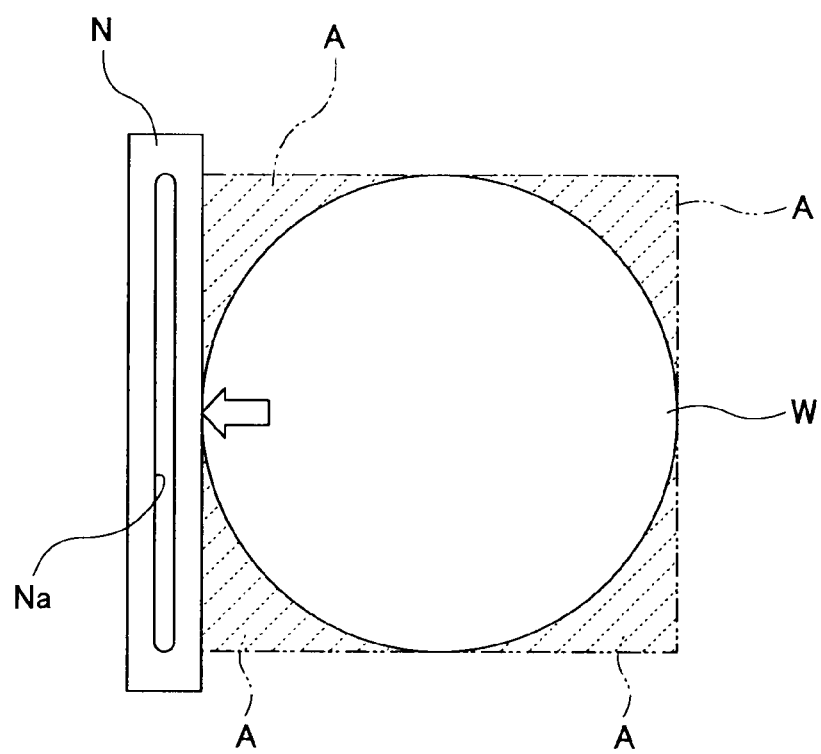
FIG. 13 is a schematic perspective view showing a process state of the conventional substrate processing apparatus.
Figure 14:
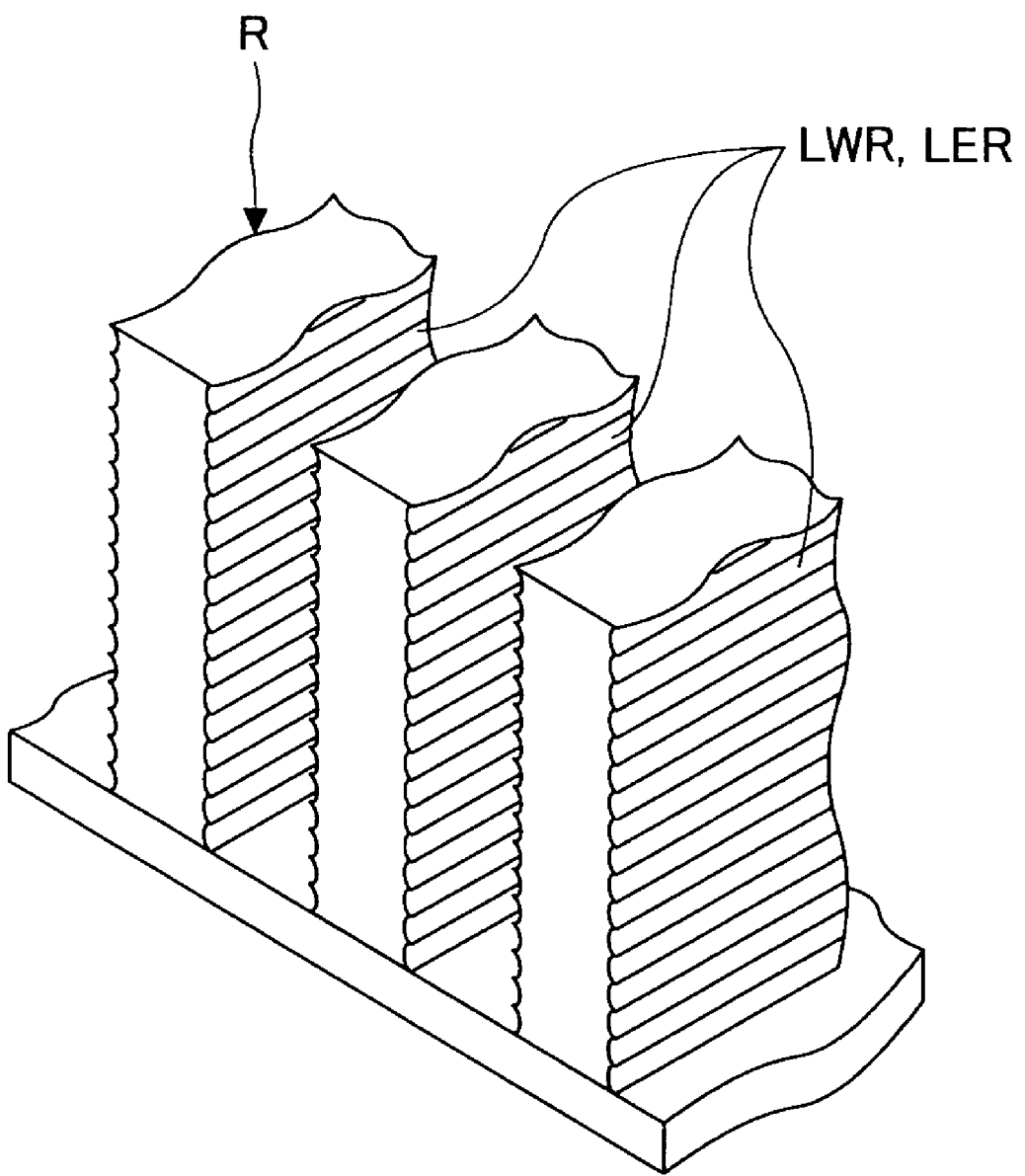
FIG. 14 is a schematic perspective view showing depressions and projections of the resist pattern surface after development.

In the aforementioned embodiments, the discharge hole 61 of the process nozzle 60 is a long hole as shown in FIG. 7, however, the discharge hole is not limited to the long hole. For example, the discharge hole may be a circular discharge hole 61a as shown in FIG. 11A, an oval discharge hole 61b as shown in FIG. 11B, a diamond shape discharge hole 61c as shown in FIG. 11C, a hexagonal discharge hole 61d as shown in FIG. 11D, a cruciform discharge hole 61e as shown in FIG. 11E, circular small discharge holes 61f staggered as shown in FIG. 11F, circular small discharge holes 61g aligned at even intervals as shown in FIG. 11G, circular small discharge holes 61h concentrically aligned at even intervals as shown in FIG. 11H, or plural slit type small discharge holes 61i aligned in parallel to each other as shown in FIG. 11I.

Next, an operation mode of the resist application and development processing system having the smoothing process apparatus 50 or 50A with the aforementioned configuration is described.

In the cassette station 10, the cover opening and closing device 5 operates to open the cover of the wafer cassette 1 of a first lot. Then, the wafer carry tweezers 4 access the cassette 1 storing unprocessed wafers W on the cassette mounting stage 2 and take one of the wafers W out. After taking out the wafer W from the cassette 1, the wafer carry tweezers 4 move to the alignment unit (ALIM) in the third plural-stage unit G3 on the process station 20 side and mounts the wafer W on the wafer mounting stage 24 in the alignment unit (ALIM). The wafer W is aligned with an orientation flat and centered on the wafer mounting stage 24. Then, the main wafer carry mechanism 21 accesses the alignment unit (ALIM) from the opposite side to receive the wafer W from the wafer mounting stage 24.

In the process station 20, the main wafer carry mechanism 21 first carries the wafer W into the adhesion unit (AD) in the third plural-stage unit G3. In the adhesion unit (AD), the wafer W undergoes a hydrophobizing process. After the hydrophobizing process, the main wafer carry mechanism 21 carries the wafer W out of the adhesion unit (AD) and into the cooling unit (COL) in the third or fourth plural-stage unit G3 or G4. In the cooling unit (COL), the wafer W is cooled down to a preset temperature before the resist application process, for example, to 23° C. After the cooling process, the main wafer carry mechanism 21 carries the wafer W out of the cooling unit (COL) and into the resist application unit (COT) in the first or second plural-stage unit G1 or G2. In this resist application unit (COT), a resist is applied over the surface of the wafer W with a uniform thickness by spin coating.

After the resist application process, the main wafer carry mechanism 21 carries the wafer W out of the resist application unit (COT) and into the hot plate unit (HP). In the hot plate unit (HP), the wafer W is mounted on the mounting stage and pre-baked for a predetermined time at a predetermined temperature such as 100° C. As a result, solvent remaining on the application film over the wafer W can be evaporated and removed. After the pre-baking, the main wafer carry mechanism 21 carries the wafer W out of the hot plate unit (HP) and into the extension cooling unit (EXTCOL) in the fourth plural-stage unit G4. In this unit (EXTCOL), the wafer W is cooled down to a temperature appropriate for the next step, that is a peripheral exposure process in the peripheral exposure apparatus, which is for example 24° C. After this cooling, the main wafer carry mechanism 21 carries the wafer W to the extension unit (EXT) right above the extension cooling unit and mounts the wafer on a mounting stage (not shown) in this unit (EXT). Then, the carry arm 34 of the interface unit 30 accesses the extension unit from the opposite side and receives the wafer. Then, the carry arm 34 carries the wafer W into the peripheral exposure apparatus 33 in the interface unit 30. In the peripheral exposure apparatus 33, an excess resist film (portion) in the periphery of the surface of the wafer W is irradiated with light, thereby the peripheral exposure is performed.

After the peripheral exposure, the carry arm 34 carries the wafer W out of the housing of the peripheral exposure apparatus 33 and into a wafer receiving stage (not shown) on the adjacent exposure apparatus 40 side.

When whole exposure of the wafer W is performed in the exposure apparatus 40 and the wafer W is carried back to the wafer receiving stage on the exposure apparatus 40 side, the carry arm 34 of the interface unit 30 accesses the wafer receiving stage and receives the wafer W. Then, the carry arm 34 carries the wafer W into the extension unit (EXT) in the fourth plural-stage unit G4 on the process station 20 side and mounts the wafer W on the wafer receiving stage.

The wafer W mounted on the wafer receiving stage is then carried into the chilling hot plate unit (CHP) by the main wafer carry mechanism 21, where a post-exposure baking process is applied to the wafer W for a predetermined time at, for example, 120° C. to prevent generation of a fringe or to induce an acid catalytic reaction of a chemical amplification resist (CAR).

Then, the wafer is carried into the development unit (DEV) in the first or second plural-stage unit G1 or G2. In this development unit (DEV), developer is supplied all over the resist film of the surface of the wafer W, whereby a development process is performed. By this development process, the resist film formed over the surface of the wafer W is developed into a predetermined circuit pattern and an excess resist film in the periphery of the wafer W is removed. Further, a resist film adhering in an area with an alignment mark M formed (applied) over the surface of the wafer W is removed. After the development, a rinse solution is applied over the surface of the wafer W to rinse off the developer.

After the development step, the main wafer carry mechanism 21 carries the wafer W out of the development unit (DEV) and into the smoothing process apparatus 50 or 50A. The wafer W carried into the smoothing process apparatus 50 or 50A is held on the chuck 52 with the surface facing up. Then, by rotating the chuck 52 while moving the process nozzle 60 horizontally from the edge to the central area of the wafer W held on the chuck 52, solvent vapor (for example, acetone, propylene glycol mono-methyl ether acetate (PGMEA), N-methyl-2-pyrolydinone (NMP) or the like) is discharged onto the resist pattern formed over the wafer. Thus, the resist pattern swells and depressions and projections of the surface of the resist pattern are smoothed. In the smoothing process apparatus of the second embodiment, the wafer is cleaned and dried after the smoothing process.

After the smoothing process, the main wafer carry mechanism 21 carries the wafer W out of the smoothing process apparatus 50 and into the hot plate unit (HP) in the third or fourth plural-stage unit G3 or G4. In this unit (HP), the wafer W undergoes post-baking for a predetermined time at, for example, 100° C. As a result, the resist swollen by the development is cured and chemical resistance is improved.

After the post-baking, the main wafer carry mechanism 21 carries the wafer W out of the hot plate unit (HP) and into any of the cooling units (COL). When the wafer W is cooled down to a normal temperature, the main wafer carry mechanism 21 carries the wafer W into the extension unit (EXT) in the third plural-stage unit G3. When the wafer W is mounted on a mounting stage (not shown) of this extension unit (EXT), the wafer carry tweezers 4 on the cassette station 10 side access the extension unit from the opposite side and receives the wafer W. Then, the wafer carry tweezers 4 put the wafer W into a predetermined wafer storing slot in the wafer cassette 1 for storing the processed wafer, which is provided on the cassette mounting stage. After all the processed wafers W are stored in the wafer cassette 1, the cover opening and closing device 5 closes the cover.

This patent application is based on Japanese Priority Patent Application No. 2007-302720 filed on Nov. 22, 2007, the entire contents of which are hereby incorporated herein by reference.

What is claimed is:

1. A substrate processing apparatus comprising:
    a substrate holding stage configured to hold a substrate with a surface of the substrate facing up, the substrate having an exposed and developed resist pattern over the surface;
    a rotation driving mechanism configured to rotate the substrate holding stage around a vertical axis;
    a solvent vapor discharge nozzle having a discharge hole capable of discharging solvent vapor to swell the resist pattern onto the surface of the substrate held on the substrate holding stage and a vacuum opening capable of absorbing the solvent vapor discharged from the discharge hole; and a moving mechanism configured to move the solvent vapor discharge nozzle from an edge to a central area of the substrate held on the substrate holding stage, wherein the substrate is rotated around the vertical axis at the same time as moving the solvent vapor discharge nozzle from the edge to the central area of the substrate while discharging the solvent vapor from the discharge hole, thereby the solvent vapor is supplied over the substrate in a spiral manner.

2. The substrate processing apparatus as claimed in claim 1, wherein a dew condensation preventive heater is provided in a vicinity of the discharge hole of the solvent vapor discharge nozzle.

3. The substrate processing apparatus as claimed in claim 1, wherein the solvent vapor discharge nozzle has a depression with a downward opening capable of holding an atmosphere of the solvent vapor, the discharge hole is provided at a bottom of the depression, and a vacuum opening is provided in a bottom end of the depression around the opening.

4. The substrate processing apparatus as claimed in claim 1, wherein an approach stage having a surface on almost the same level as the surface of the substrate held on the substrate holding stage is provided in a vicinity of the substrate holding stage.

5. A substrate processing apparatus comprising:
a substrate holding stage configured to hold a substrate with a surface of the substrate facing up, the substrate having an exposed and developed resist pattern over the surface;
a rotation driving mechanism configured to rotate the substrate holding stage around a vertical axis;
a solvent vapor discharge nozzle having a discharge hole capable of discharging solvent vapor to swell the resist pattern onto the surface of the substrate held on the substrate holding stage and a vacuum opening capable of absorbing the solvent vapor discharged from the discharge hole;
a cleaning nozzle provided adjacently to the solvent vapor discharge nozzle and configured to discharge a cleaning solvent onto the surface of the substrate held on the substrate holding stage;
a moving mechanism configured to move the solvent vapor discharge nozzle and the cleaning nozzle from an edge to a central area of the substrate held on the substrate holding stage;
a cup configured to surround a side and a bottom of the substrate holding stage; and
an elevating mechanism configured to elevate a side wall of the cup,
wherein the substrate is rotated around the vertical axis at the same time as moving the solvent vapor discharge nozzle from the edge to the central area of the substrate while discharging the solvent vapor from the discharge hole to supply the solvent vapor over the substrate in a spiral manner, then the substrate is rotated around the vertical axis and the cleaning solvent is supplied from the cleaning nozzle onto the central area of the substrate with the side wall of the cup elevated, and the supply of the cleaning solvent is stopped and the substrate is rotated around the vertical axis to remove the cleaning solvent with the side wall of the cup elevated.

6. The substrate processing apparatus as claimed in claim 5, wherein a top portion of the cup includes an approach stage having a surface on almost the same level as the surface of the substrate held on the substrate holding stage.

7. The substrate processing apparatus as claimed in claim 5, wherein a dew condensation preventive heater is provided in a vicinity of the discharge hole of the solvent vapor discharge nozzle.

* * * * *